(12) United States Patent
Gong

(10) Patent No.: US 10,917,054 B2
(45) Date of Patent: Feb. 9, 2021

(54) TOWER MOUNTED AMPLIFIER

(71) Applicant: HUAWEI TECHNOLOGIES CO., LTD., Guangdong (CN)

(72) Inventor: Lanping Gong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 65 days.

(21) Appl. No.: 16/287,158

(22) Filed: Feb. 27, 2019

(65) Prior Publication Data

US 2019/0199299 A1 Jun. 27, 2019

Related U.S. Application Data

(63) Continuation of application No. PCT/CN2017/098538, filed on Aug. 22, 2017.

(30) Foreign Application Priority Data

Aug. 29, 2016 (CN) .......................... 2016 1 0768336

(51) Int. Cl.
 *H03F 3/189* (2006.01)
 *H03F 3/21* (2006.01)
 *H04B 7/155* (2006.01)
 *H04W 88/08* (2009.01)

(52) U.S. Cl.
 CPC ......... *H03F 3/189* (2013.01); *H04B 7/15542* (2013.01); *H03F 2200/165* (2013.01); *H03F 2200/171* (2013.01); *H03F 2200/294* (2013.01); *H03F 2200/451* (2013.01); *H04B 7/15535* (2013.01); *H04W 88/08* (2013.01)

(58) Field of Classification Search
 USPC ............................. 330/124 R, 295, 302, 75
 See application file for complete search history.

(56) References Cited

U.S. PATENT DOCUMENTS

| 9,788,274 | B2* | 10/2017 | Cook | H04W 52/0229 |
|---|---|---|---|---|
| 10,050,694 | B2* | 8/2018 | Wloczysiak | H03F 3/72 |
| 2013/0157720 | A1 | 6/2013 | Schiff | |

FOREIGN PATENT DOCUMENTS

| CN | 1741641 A | 3/2006 |
|---|---|---|
| CN | 201656970 U | 11/2010 |
| CN | 101969333 A | 2/2011 |
| CN | 102231637 A | 11/2011 |
| CN | 103095361 A | 5/2013 |

(Continued)

OTHER PUBLICATIONS

Extended European Search Report issued in European Application No. 17845287.6 dated Jul. 5, 2019, 9 pages.

(Continued)

*Primary Examiner* — Hieu P Nguyen
(74) *Attorney, Agent, or Firm* — Fish & Richardson P.C.

(57) ABSTRACT

A tower mounted amplifier is provided. The tower mounted amplifier includes: a first port, connected to an antenna of a base station; a first band-pass filter, where an input end of the first band-pass filter is connected to the first port; a first amplifier, where an input end of the first amplifier is connected to an output end of the first band-pass filter; a second band-pass filter, where an input end of the second band-pass filter is connected to an output end of the first amplifier, connected to an output end of the second band-pass filter and the base station.

9 Claims, 8 Drawing Sheets

(56) References Cited

FOREIGN PATENT DOCUMENTS

| | | |
|---|---|---|
| CN | 102594431 B | 7/2014 |
| CN | 106411385 A | 2/2017 |
| GB | 2501363 A | 10/2013 |
| KR | 20060125184 A | 12/2006 |
| KR | 20080070243 A | 7/2008 |

OTHER PUBLICATIONS

International Search Report and Written Opinion issued in International Application No. PCT/CN2017/098538 dated Nov. 10, 2017, 46 pages.

* cited by examiner

US 10,917,054 B2

TOWER MOUNTED AMPLIFIER

CROSS-REFERENCE TO RELATED APPLICATIONS

This application is a continuation of International Application No. PCT/CN2017/098538, filed on Aug. 22, 2017, which claims priority to Chinese Patent Application No. 201610768336.1, filed on Aug. 29, 2016. The disclosures of the aforementioned applications are hereby incorporated by reference in their entireties.

TECHNICAL FIELD

The present application relates to the field of communications technologies, and in particular, to a tower mounted amplifier.

BACKGROUND

A tower mounted amplifier (TMA) is mounted on the top of a transmit tower, and is an amplifier that is right behind an antenna. Before an uplink signal received by the antenna enters a feeder, the tower mounted amplifier may amplify the received uplink signal, to improve uplink signal quality, call reliability, and voice quality, and to enlarge a cell coverage area.

For a current tower mounted amplifier, a corresponding filter needs to be disposed for each frequency band. For example, a quantity of filters disposed on a dual-band tower mounted amplifier needs to be doubled, and other cases are processed by analogy. It can be learned that if more frequency bands need to be processed, more filters need to be disposed on the tower mounted amplifier. An increase in a quantity of filters leads to a corresponding increase in a volume and costs of the tower mounted amplifier, and this is apparently not favorable to use of the tower mounted amplifier.

SUMMARY

Embodiments of the present application provide a tower mounted amplifier, configured to support a relatively large quantity of frequency bands by using a relatively small quantity of filters, to reduce a volume and costs of the tower mounted amplifier.

According to a first aspect, a tower mounted amplifier is provided, and the tower mounted amplifier includes a first port, a first band-pass filter, a first amplifier, a second band-pass filter, and a second port. The first port is connected to an antenna and is configured to perform signal interaction with the antenna. An input end of the first band-pass filter is connected to the first port, and the first band-pass filter is configured to obtain signals in at least two frequency bands through separation from uplink signals that are sent by the antenna and received by the first port. An input end of the first amplifier is connected to an output end of the first band-pass filter, and the first amplifier is configured to amplify the uplink signals that are in the at least two frequency bands and that are output by the first band-pass filter. An input end of the second band-pass filter is connected to an output end of the first amplifier, and the second band-pass filter is configured to receive the amplified uplink signals that are in the at least two frequency bands and that are output by the first amplifier. The second port is connected to an output end of the second band-pass filter and a base station, and is configured to output, to the base station, the amplified uplink signals that are in the at least two frequency bands and that are output by the second band-pass filter.

The tower mounted amplifier is an amplifier that is mounted on the top of a transmit tower and that is right behind a receive antenna of the base station. Before an uplink signal received by the antenna enters a feeder, the tower mounted amplifier may amplify the received uplink signal, to improve uplink signal quality, call reliability, and voice quality, and to enlarge a cell coverage area.

Both the first band-pass filter and the second band-pass filter included in the tower mounted amplifier in this embodiment of the present application can obtain signals in at least two frequency bands through filtering. According to a prior-art solution, uplink signals in each frequency band need to correspond to two filters, and therefore signals in at least two frequency bands need at least four filters. However, in this embodiment of the present application, signals in at least two frequency bands can be obtained by using only two band-pass filters, thereby reducing a quantity of filters, costs, and a volume of the tower mounted amplifier, and helping dispose the tower mounted amplifier on the transmit tower. A plurality of frequency bands can be supported by using only one tower mounted amplifier instead of a plurality of tower mounted amplifiers. In this case, costs are reduced, and a deployment manner of a communications system is simplified.

With reference to the first aspect, in a first possible implementation of the first aspect, that the first band-pass filter is configured to obtain signals in at least two frequency bands through separation from uplink signals that are sent by the antenna and received by the first port may be implemented in the following manner: The first band-pass filter is configured to obtain an uplink signal in a first frequency band and an uplink signal in a second frequency band through separation from the uplink signals that are sent by the antenna and received by the first port.

In this embodiment of the present application, the first band-pass filter can obtain uplink signals in two frequency bands, so that load of the first band-pass filter can be lightened, and a structure of the first band-pass filter is not excessively complex.

With reference to the first possible implementation of the first aspect, in a second possible implementation of the first aspect, the first frequency band ranges from 832 MHz to 862 MHz, and the second frequency band ranges from 880 MHz to 915 MHz.

In other words, the first frequency band is an uplink frequency band of a band 20, the second frequency band is an uplink frequency band of a band 8, and both the band 20 and the band 8 are currently commonly used frequency bands. In such a design, the tower mounted amplifier in this embodiment of the present application can meet requirements of most current scenarios.

With reference to the first aspect, or the first or the second possible implementation of the first aspect, in a third possible implementation of the first aspect, the tower mounted amplifier further includes a third band-pass filter, an output end of the third band-pass filter is connected to the first port, and an input end of the third band-pass filter is connected to the second port. The third band-pass filter is configured to: obtain downlink signals in at least two frequency bands through separation from downlink signals that are sent by the base station and received by the second port, and output the downlink signals of the at least two frequency bands to the antenna by using the first port.

The third band-pass filter is added, so that the tower mounted amplifier in this embodiment of the present application can not only amplify an uplink signal, but also process a downlink signal, and a function is improved. In addition, the tower mounted amplifier can process downlink signals in a plurality of frequency bands by using the third band-pass filter that can obtain at least two frequency bands, to reduce a quantity of required filters, costs, and a volume of the tower mounted amplifier.

With reference to the third possible implementation of the first aspect, in a fourth possible implementation of the first aspect, that the third band-pass filter is configured to obtain downlink signals in at least two frequency bands through separation from downlink signals that are sent by the base station and received by the second port may be implemented in the following manner: The third band-pass filter is configured to obtain a downlink signal in a third frequency band and a downlink signal in a fourth frequency band through separation from the downlink signals that are sent by the base station and received by the second port.

In this embodiment of the present application, the third band-pass filter can obtain uplink signals in two frequency bands, so that load of the third band-pass filter can be lightened, and a structure of the third band-pass filter is not excessively complex.

With reference to the fourth possible implementation of the first aspect, in a fifth possible implementation of the first aspect, the third frequency band ranges from 791 MHz to 821 MHz, and the fourth frequency band ranges from 758 MHz to 803 MHz.

In other words, the third frequency band is a downlink frequency band of the band 20, and the fourth frequency band is a downlink frequency band of a band 28. Both the band 20 and the band 28 are currently commonly used frequency bands. In such a design, the tower mounted amplifier in this embodiment of the present application can meet requirements of most current scenarios.

With reference to any one of the first aspect and the first to the fifth possible implementations of the first aspect, in a sixth possible implementation of the first aspect, the first amplifier is a low noise amplifier.

In some occasions, noise of an amplifier may seriously affect a signal, especially when a weak signal is being amplified, and if the noise of the amplifier is excessively large, a capability of a receive end to detect the weak signal is affected. Therefore, in this embodiment of the present application, the first amplifier is designed as a low noise amplifier, to reduce the noise of the amplifier and improve a signal receiving capability.

With reference to any one of the first aspect and the first to the sixth possible implementations of the first aspect, in a seventh possible implementation of the first aspect, a control end of the first amplifier is connected to a control circuit in the tower mounted amplifier, and the second port is also connected to the control circuit.

The control circuit in the tower mounted amplifier may control the first amplifier, and therefore the control end of the first amplifier may be connected to the control circuit.

With reference to any one of the first aspect and the first to the seventh possible implementations of the first aspect, in an eighth possible implementation of the first aspect, the tower mounted amplifier further includes a fourth band-pass filter, a second amplifier, and a fifth band-pass filter. An input end of the fourth band-pass filter is connected to the first port, and the fourth band-pass filter is configured to obtain an uplink signal in at least one frequency band through separation from the uplink signals that are sent by the antenna and received by the first port. An input end of the second amplifier is connected to an output end of the fourth band-pass filter, and the second amplifier is configured to amplify the uplink signal that is in the at least one frequency band and that is output by the fourth band-pass filter. An input end of the fifth band-pass filter is connected to an output end of the second amplifier, and the fifth band-pass filter is configured to: receive the amplified uplink signal that is in the at least one frequency band and that is output by the second amplifier, and output the amplified uplink signal in the at least one frequency band to the base station by using the second port.

In this embodiment of the present application, to process an uplink signal, the tower mounted amplifier may include a band-pass filter that can obtain an signals in at least two frequency bands through filtering, and may further include a band-pass filter that can obtain an uplink signal in at least one frequency band through filtering, so that the tower mounted amplifier can flexibly process more frequency bands.

With reference to any one of the first aspect and the first to the eighth possible implementations of the first aspect, in a ninth possible implementation of the first aspect, the tower mounted amplifier further includes a sixth band-pass filter, an output end of the sixth band-pass filter is connected to the first port, and an input end of the sixth band-pass filter is connected to the second port. The sixth band-pass filter is configured to: obtain a downlink signal in at least one frequency band through separation from the downlink signals that are sent by the base station and received by the second port, and output the downlink signal in the at least one frequency band to the antenna by using the first port.

In this embodiment of the present application, to process a downlink signal, the tower mounted amplifier may include a band-pass filter that can obtain downlink signals in at least two frequency bands through filtering, and may further include a band-pass filter that can obtain a downlink signal in at least one frequency band through filtering, so that the tower mounted amplifier can flexibly process more frequency bands.

The tower mounted amplifier in the embodiments of the present application uses fewer filters, thereby reducing costs and the volume of the tower mounted amplifier, and helping dispose the tower mounted amplifier on the transmit tower. A plurality of frequency bands can be supported by using only one tower mounted amplifier instead of a plurality of tower mounted amplifiers. In this case, costs are reduced, and a deployment manner of a communications system is simplified.

DESCRIPTION OF EMBODIMENTS

Figure 1:
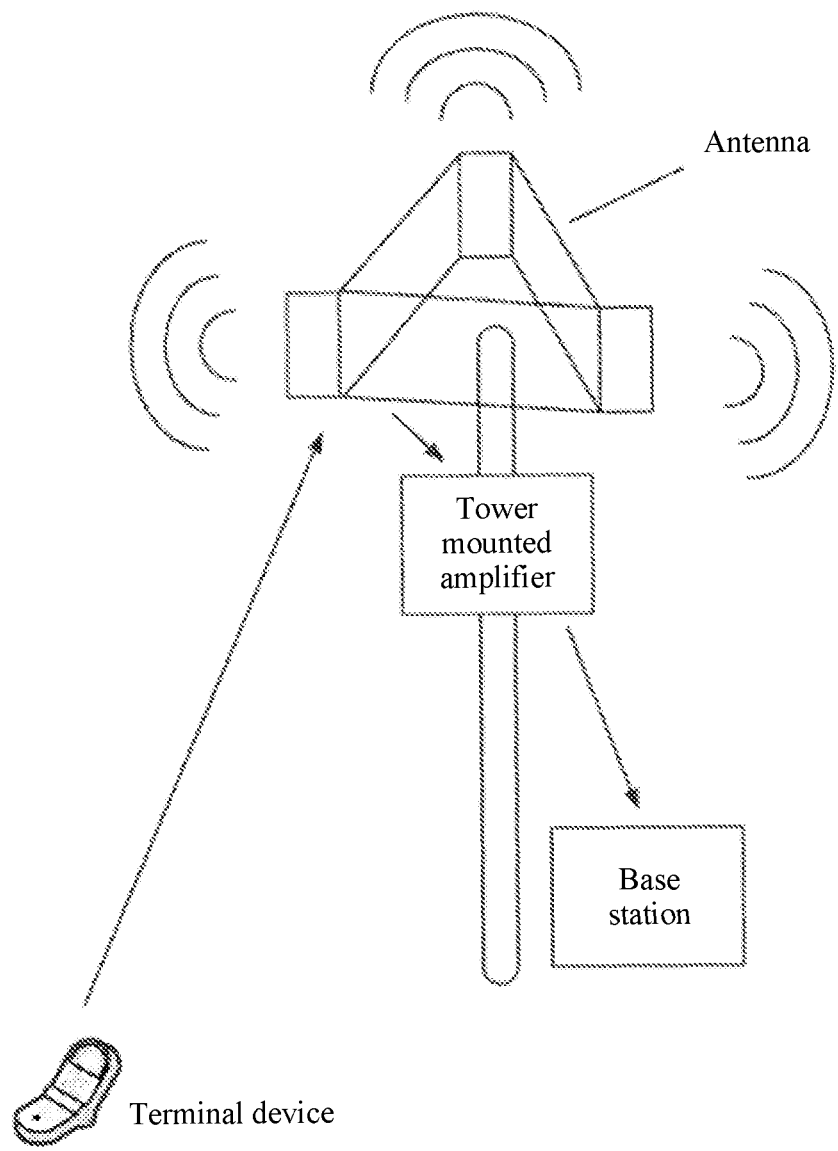
FIG. 1 is a schematic diagram of an application scenario according to an embodiment of the present application.

To make the objectives, technical solutions, and advantages of the embodiments of the present application clearer, the following clearly describes the technical solutions in the embodiments of the present application with reference to the accompanying drawings in the embodiments of the present application. Apparently, the described embodiments are some but not all of the embodiments of the present application. All other embodiments obtained by a person of ordinary skill in the art based on the embodiments of the present application without creative efforts shall fall within the protection scope of the present application.

Technologies described in this specification may be applied to various communications systems, for example, 3G 4G and a next-generation communications system, for example, a Global System for Mobile Communications (GSM), a Code Division Multiple Access (CDMA) system, a Time Division Multiple Access (TDMA) system, a Wideband Code Division Multiple Access (WCDMA) system, a Frequency Division Multiple Access (FDMA) system, an orthogonal Frequency Division Multiple Access (OFDMA) system, an SC-FDMA system, a general packet radio service (GPRS) system, a Long Term Evolution (LTE) system, a future 5G system, and another possible communications system.

Some terms in the embodiments of the present application are described below, so that a person skilled in the art can have a better understanding.

1. A tower mounted amplifier is an amplifier that is mounted on the top of a transmit tower and that is right behind a receive antenna of a base station, and is usually a low noise amplifier. Before an uplink signal received by the antenna enters a feeder, the tower mounted amplifier may amplify the received uplink signal by 12 dB, to improve uplink signal quality, call reliability, and voice quality, and to enlarge a cell coverage area.

2. A base station (for example, an access point) may be a device that communicates with a wireless terminal device by using one or more sectors at an air interface in an access network. The base station may be configured to mutually convert a received over-the-air frame and an Internet Protocol (IP) packet and serve as a router between the wireless terminal device and a remaining part of the access network, where the remaining part of the access network may include an IP network. The base station may further coordinate attribute management of the air interface. For example, the base station may include a radio network controller (RNC) or a base station controller (BSC), or may include an evolved NodeB (eNB, or eNodeB, evolutional NodeB) in an LTE-Advanced (LTE-A) system. This is not limited in the embodiments of the present application.

3. Terms "system" and "network" may be used interchangeably in the embodiments of the present application. The term "a plurality of" means "at least two". In view of this, "a plurality of" can be understood as "at least two" in the embodiments of the present application. The term "and/or" describes an association relationship of associated objects and represents that three relationships may exist. For example, A and/or B may represent the following three cases: Only A exists, both A and B exist, and only B exists. In addition, the character "/" generally indicates an "or" relationship between the associated objects unless otherwise specified.

FIG. 1 is a schematic diagram of an application scenario according to an embodiment of the present application. It may be seen from FIG. 1 that a tower mounted amplifier is disposed on a transmit tower, and is located below a receive antenna of a base station. The base station may communicate with a terminal device. An uplink signal sent by the terminal device to the base station is amplified by the tower mounted amplifier and then transmitted to the base station. An arrow in FIG. 1 indicates a transmission path of the uplink signal sent by the terminal device. For example, the terminal device in FIG. 1 is a mobile phone.

The technical solutions provided in the embodiments of the present application are described below with reference to the accompanying drawings.

Figure 2:
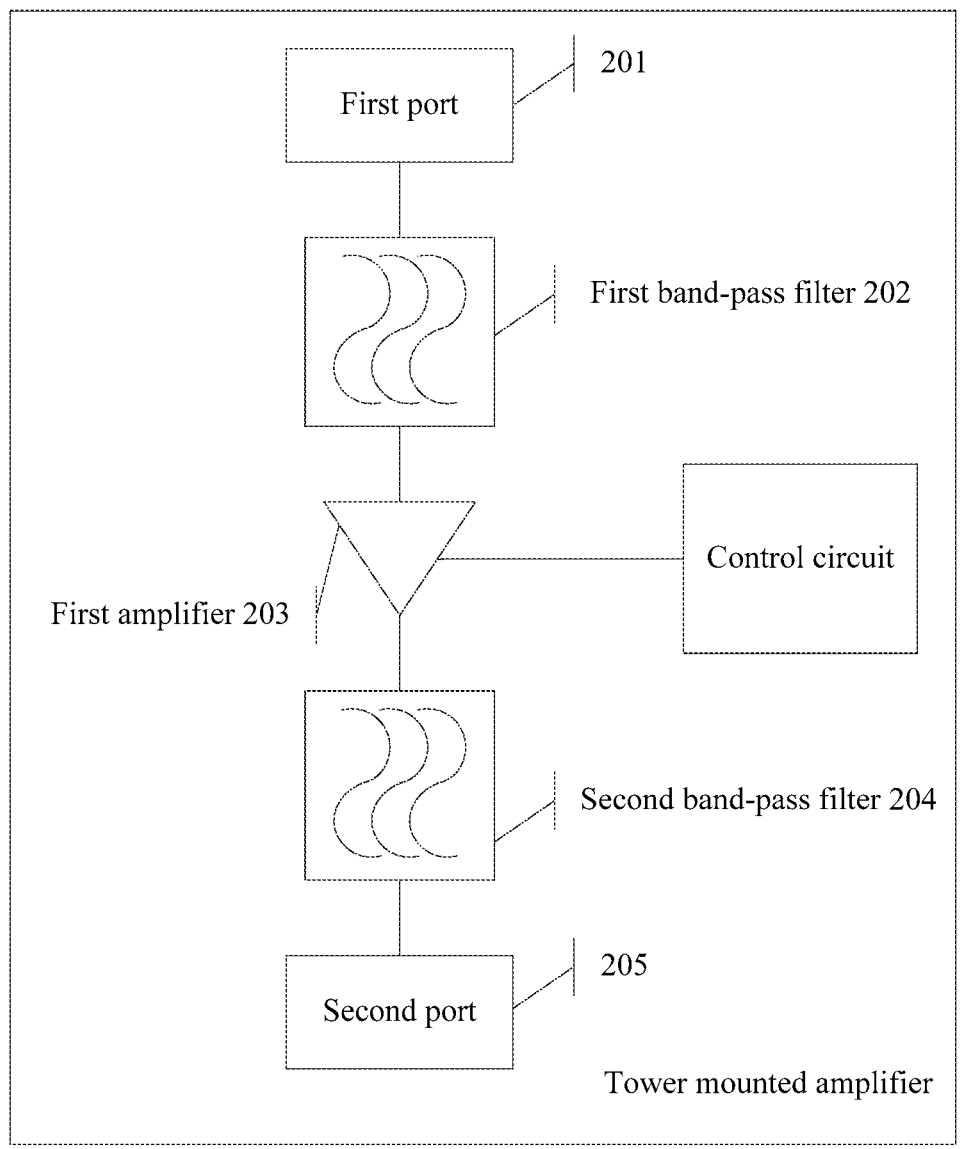
FIG. 2 is a schematic structural diagram of a tower mounted amplifier according to an embodiment of the present application.

Referring to FIG. 2, an embodiment of the present application provides a tower mounted amplifier, and the tower mounted amplifier may include a first port 201, a first band-pass filter 202, a first amplifier 203, a second band-pass filter 204, and a second port 205.

The first port 201 is connected to an antenna and is configured to perform signal interaction with the antenna. The interaction herein means that the first port 201 can receive an uplink signal transmitted by the antenna, and can also transmit a downlink signal sent by a base station to the antenna for sending.

An input end of the first band-pass filter 202 is connected to the first port 201, the first band-pass filter 202 may receive, by using the first port 201, the uplink signal transmitted by the antenna, and the uplink signal received by the first port 201 may be a signal obtained after uplink signals in a plurality of frequency bands are coupled. The first band-pass filter 202 may separate the uplink signal to obtain uplink signals in at least two frequency bands. In a receiving process, the first band-pass filter 202 may also be referred to as a pre-filter.

An input end of the first amplifier 203 is connected to an output end of the first band-pass filter 202, and the first amplifier 203 may amplify the uplink signals that are in the at least two frequency bands and that are output by the first band-pass filter 202. In FIG. 1, a control end of the first amplifier 203 may be connected to a control circuit in the tower mounted amplifier, and the first amplifier 203 is controlled by the control circuit.

An input end of the second band-pass filter 204 is connected to an output end of the first amplifier 203, and the second band-pass filter 204 may receive the amplified uplink signals that are in the at least two frequency bands and that are output by the first amplifier 203. In a receiving process, the second band-pass filter 204 may also be referred to as a post-filter. If the tower mounted amplifier can process a downlink signal in addition to the uplink signal, the second band-pass filter 204 processing the uplink signal and a component processing the downlink signal may share the second port 205, in other words, both the second band-pass filter 204 and the component are connected to the second port 205. The downlink signal sent by the base station may also enter, by using the second port 205, the component that processes the downlink signal and that is in the tower mounted amplifier. In a normal case, the downlink signal enters the corresponding component along another path after entering the second port 205. However, the downlink signal may flow back to the first amplifier 203 because of a cause such as a fault. This may damage the first amplifier 203. In view of this, the second band-pass filter 204 is disposed to effectively prevent the downlink signal sent by the base station from flowing back to the first amplifier 203, so that the circuit is protected. In addition, for another function of the second band-pass filter 204 used as a post-filter, refer to a function of a post-filter in the prior art. Details are not described.

The second port 205 is connected to an output end of the second band-pass filter 204 and the base station, and may output, to the base station, the amplified uplink signals that are in the at least two frequency bands and that are output by the second band-pass filter 204.

In an implementation, the first amplifier 203 may be a low noise amplifier (LNA) or an amplifier of another type.

The first band-pass filter 202 may obtain the uplink signals in the at least two frequency bands through filtering, and the second band-pass filter 204 may receive the amplified uplink signals in the at least two frequency bands. The at least two frequency bands may be frequency bands that are pairwise intersected with each other, or may be frequency bands that are pairwise adjacent to each other. If there is no downlink frequency band between two uplink frequency bands, it may be considered that the two uplink frequency bands are adjacent to each other. Certainly, both the uplink frequency band and the downlink frequency band herein are frequency bands to be processed by the tower mounted amplifier.

In an implementation, the first band-pass filter 202 may obtain an uplink signal in a first frequency band and an uplink signal in a second frequency band through separation from uplink signals received by the first port 201 from the antenna. The second band-pass filter 204 may receive the amplified uplink signal in the first frequency band and the amplified uplink signal in the second frequency band that are output by the first amplifier 203. In other words, the first band-pass filter 202 and the second band-pass filter 204 may process a same frequency band. The first band-pass filter 202 may obtain uplink signals in two frequency bands through filtering, and the second band-pass filter 204 may receive amplified uplink signals in the two frequency bands.

In an implementation, the first frequency band may range from 832 MHz to 862 MHz, or may be indicated as [832 MHz, 862 MHz]; and the second frequency band may range from 880 MHz to 915 MHz, or may be indicated as [880 MHz, 915 MHz]. In other words, the first frequency band is an uplink frequency band of a band 20, and the second frequency band is an uplink frequency band of a band 8. An uplink frequency band of a band 28 ranges from 703 MHz to 748 MHz, or may be indicated as [703 MHz, 748 MHz], and there are a downlink frequency band of the band 20 and a downlink frequency band of the band 28 between the uplink frequency band of the band 28 and the uplink frequency band of the band 20. Both the band 20 and the band 28 are frequency bands to be processed by the tower mounted amplifier. Therefore, the first band-pass filter 202 may not process the uplink frequency band of the band 28.

A procedure of amplifying an uplink signal by the tower mounted amplifier is described as follows:

Coupled uplink signals from the antenna pass through the first port 201, and the first band-pass filter 202 receives the uplink signals from the first port 201. The first band-pass filter 202 separates, through filtering, the uplink signals to obtain an uplink signal in the band 20 and an uplink signal in the band 8. The first band-pass filter 202 sends, to the first amplifier 203 for amplification, the uplink signal in the band 20 and the uplink signal in the band 8 that are obtained through separation. The second band-pass filter 204 receives the amplified uplink signal in the band 20 and the amplified uplink signal in the band 8 that are output by the first amplifier 203. The second band-pass filter 204 outputs the received amplified uplink signal in the band 20 and the received amplified uplink signal in the band 8 to the base station by using the second port 205. In this case, a process of receiving and amplifying the uplink signal is completed. The second band-pass filter 204 may send the received amplified uplink signal in the band 20 and the received amplified uplink signal in the band 8 to a combiner. For example, the combiner is referred to as a first combiner. The first combiner combines signals, and outputs a signal obtained through combination to the base station by using the second port 205. The first combiner is not shown in the figure.

It can be learned that a band-pass filter can process signals in a plurality of frequency bands, and therefore the tower mounted amplifier in this embodiment of the present application may collectively configure one set of band-pass filters for signals in at least two frequency bands (in this embodiment of the present application, for example, one set of band-pass filters includes two band-pass filters). The uplink signals in the at least two frequency bands can be processed by using one set of band-pass filters, so that there is no need to configure one set of filters for an uplink signal in each frequency band. This greatly reduces a quantity of filters in the tower mounted amplifier, especially when a relatively large quantity of frequency bands need to be processed. It is advantageous to apply the solution provided in this embodiment of the present application: A volume of the tower mounted amplifier can be reduced to a relatively large extent, and this helps dispose the tower mounted amplifier on a transmit tower; and in addition, costs of the tower mounted amplifier are reduced because a quantity of required hardware is reduced. In addition, a plurality of frequency bands can be supported by using only one tower mounted amplifier, and there is no need to use a plurality of tower mounted amplifiers to separately support the plurality of frequency bands. In this case, costs are reduced, and a deployment manner of a communications system is simplified.

The first frequency band and the second frequency band above are merely an example. In actual application, the first band-pass filter 202 and the second band-pass filter 204 may further obtain uplink signals in more frequency bands through filtering, and uplink signals that are in specific frequency bands and that are obtained by the first band-pass filter 202 and the second band-pass filter 204 through filtering are not limited in this embodiment of the present application.

Figure 3:
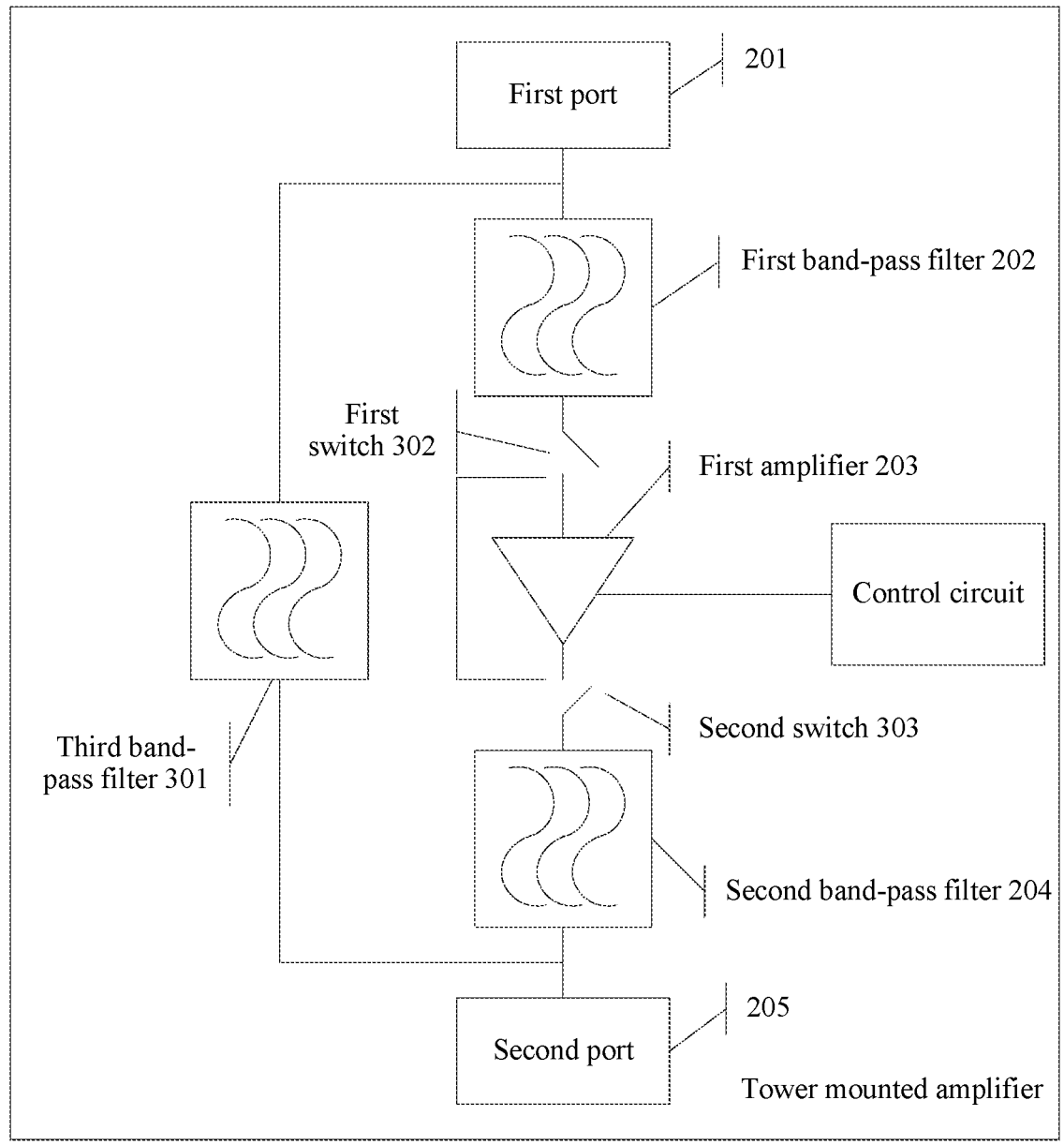
FIG. 3 is a schematic diagram of a tower mounted amplifier to which a third band-pass filter is added according to an embodiment of the present application.

In an implementation, the tower mounted amplifier can not only amplify an uplink signal but also process a downlink signal. When processing the downlink signal, the tower mounted amplifier may also process downlink signals in a plurality of frequency bands by using one band-pass filter. In this case, the tower mounted amplifier may further include a third band-pass filter 301. Referring to FIG. 3, an output end of the third band-pass filter 301 is connected to the first port 201, and an input end of the third band-pass filter 301 is connected to the second port 205. The third band-pass filter 301 may be configured to: obtain downlink signals in at least two frequency bands through separation from downlink signals that are sent by the base station and received by the second port 205, and output the downlink signals of the at least two frequency bands to the antenna by using the first port 201. In addition, it should be noted that in FIG. 3, a switch is disposed on each of the input end and the output end of the first amplifier 203. A switch disposed on the input end of the first amplifier 203 is referred to as a first switch 302, a switch disposed on the output end of the first amplifier 203 is referred to as a second switch 303, and both the two switches can control a working status of the first amplifier 203.

The third band-pass filter 301 may obtain downlink signals in at least two frequency bands through filtering. Because the TMA does not need to amplify the downlink signals, only one filter needs to be configured, in other words, there is no need to configure a pre-filter or a post-filter. Similarly, the at least two frequency bands processed by the third band-pass filter 301 may be frequency bands that are pairwise intersected with each other, or may be frequency bands that are pairwise adjacent to each other. If there is no uplink frequency band between two downlink frequency bands, it may be considered that the two downlink frequency bands are adjacent to each other. Certainly, both the uplink frequency band and the downlink frequency band herein are frequency bands to be processed by the tower mounted amplifier.

In an implementation, the third band-pass filter 301 may obtain a downlink signal in a third frequency band and a downlink signal in a fourth frequency band through separation from the downlink signals that are sent by the base station and received by the second port 205, in other words, the third band-pass filter 301 may obtain downlink signals of two frequency bands through filtering. The at least two frequency bands processed by the third band-pass filter 301 and the at least two frequency bands processed by the first band-pass filter 202 may belong to a same band, for example, if the first frequency band is the uplink frequency band of the band 20, and the second frequency band is the uplink frequency band of the band 8, the third frequency band is the downlink frequency band of the band 20, and the fourth frequency band is the downlink frequency band of the band 8. Alternatively, the at least two frequency bands processed by the third band-pass filter 301 and the at least two frequency bands processed by the first band-pass filter 202 may not belong to a same frequency band, so that neither the third frequency band nor the fourth frequency band is the downlink frequency band of the band 20 or the downlink frequency band of the band 8. Alternatively, some of the frequency bands processed by the third band-pass filter 301 and the frequency bands processed by the first band-pass filter 202 may belong to a same frequency band, so that the third frequency band is the downlink frequency band of the band 20 and the fourth frequency band is not the downlink frequency band of the band 8, or the third frequency band is not the downlink frequency band of the band 20 and the fourth frequency band is the downlink frequency band of the band 8.

For example, the tower mounted amplifier processes signals of frequency bands such as the band 8, the band 20, and the band 28. In one implementation, the third frequency band may range from 791 MHz to 821 MHz, or may be indicated as [791 MHz, 821 MHz]; and the fourth frequency band may range from 758 MHz to 803 MHz, or may be indicated as [758 MHz, 803 MHz]. In other words, the third frequency band is the downlink frequency band of the band 20, and the fourth frequency band is the downlink frequency band of the band 28. The downlink frequency band of the band 8 ranges from 925 MHz to 960 MHz, or is indicated as [925 MHz, 960 MHz], and there are the uplink frequency band of the band 8 and the uplink frequency band of the band 20 between the downlink frequency band of the band 8 and both the downlink frequency band of the band 20 and the downlink frequency band of the band 28. Therefore, the third band-pass filter 301 may not process the downlink frequency band of the band 8. It can be learned that the third frequency band and the fourth frequency band are intersected frequency bands.

After the third band-pass filter 301 is added, the tower mounted amplifier can amplify a downlink signal. A procedure of amplifying a downlink signal by the tower mounted amplifier is described as follows:

A downlink signal from the base station passes through the second port 205, and the third band-pass filter 301 receives the downlink signal from the second port 205. The third band-pass filter 301 separates, through filtering, the downlink signal to obtain a downlink signal in the band 20 and a downlink signal in the band 28. The third band-pass filter 301 outputs the obtained downlink signal in the band 20 and the obtained downlink signal in the band 28 to the antenna by using the first port 201. Therefore, the process of amplifying the downlink signal is completed. The third band-pass filter 301 may send the obtained downlink signal in the band 20 and the obtained downlink signal in the band 28 to a combiner. For example, the combiner is referred to as a second combiner. The second combiner combines the signals, and outputs a signal obtained through combination to the antenna by using the first port 201. The second combiner is not shown in the figure.

The tower mounted amplifier in this embodiment of the present application can not only amplify an uplink signal but also process a downlink signal, and a function is improved. In addition, the tower mounted amplifier can process downlink signals in a plurality of frequency bands by using a band-pass filter that can obtain at least two frequency bands, to reduce a quantity of required filters, costs, and the volume of the tower mounted amplifier.

In this embodiment of the present application, to process an uplink signal, the tower mounted amplifier may include a band-pass filter that can obtain signals in at least two frequency bands through filtering, and may further include a band-pass filter that can obtain an uplink signal in at least one frequency band through filtering.

Figure 4A:
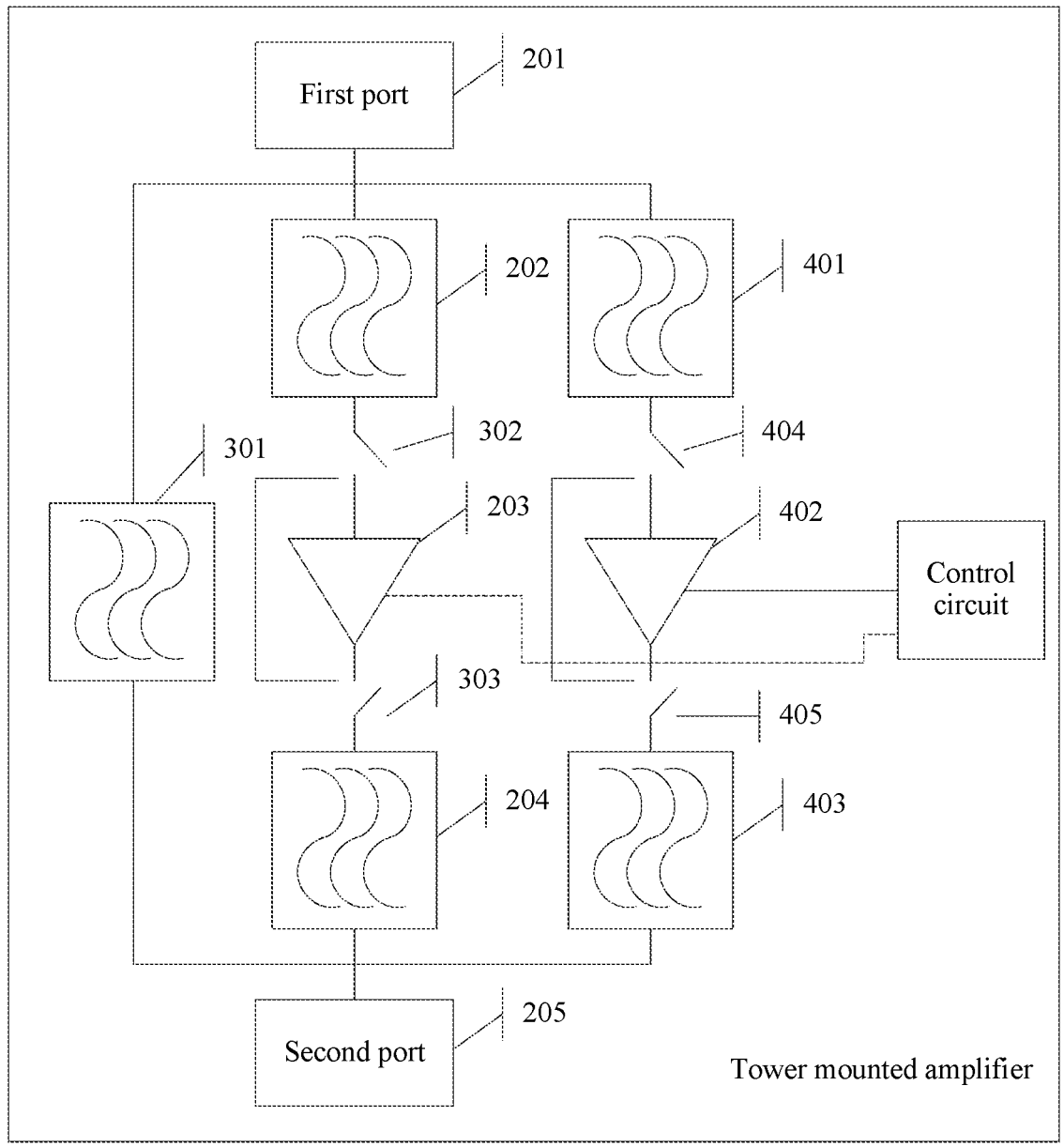
FIG. 4A and FIG. 4B are schematic diagrams of a tower mounted amplifier to which a fourth band-pass filter and a fifth band-pass filter are added according to an embodiment of the present application.

Referring to FIG. 4A, in an implementation, the tower mounted amplifier may further include a fourth band-pass filter 401, a second amplifier 402, and a fifth band-pass filter 403.

An input end of the fourth band-pass filter 401 is connected to the first port 201, and the fourth band-pass filter 401 is configured to obtain an uplink signal in at least one frequency band through separation from the uplink signals that are sent by the antenna and received by the first port 201. In a receiving process, the fourth band-pass filter 401 may also be referred to as a pre-filter.

An input end of the second amplifier 402 is connected to an output end of the fourth band-pass filter 401, and the second amplifier 402 is configured to amplify the uplink signal that is in the at least one frequency band and that is output by the fourth band-pass filter 401.

An input end of the fifth band-pass filter 403 is connected to an output end of the second amplifier 402, an output end of the fifth band-pass filter 403 is connected to the second port 205, and the fifth band-pass filter 403 is configured to: receive the amplified uplink signal that is in the at least one frequency band and that is output by the second amplifier 402, and output the amplified uplink signal in the at least one frequency band to the base station by using the second port 205. In a receiving process, the fifth band-pass filter 403 may also be referred to as a post-filter. Similarly, the fifth band-pass filter 403 is disposed to effectively prevent the downlink signal sent by the base station from flowing back to the second amplifier 402. In addition, for another function of the fifth band-pass filter 403 used as a post-filter, refer to a function of a post-filter in the prior art. Details are not described.

A switch may be disposed on each of the input end and the output end of the second amplifier 402, and is shown in FIG. 4. A switch disposed on the input end of the second amplifier 402 is referred to as a third switch 404, a switch disposed on the output end of the second amplifier 402 is referred to as a fourth switch 405, and both the two switches may control a working status of the second amplifier 402.

In an implementation, the second amplifier 402 may be an LNA or an amplifier of another type.

In an implementation, the fourth band-pass filter 401 may obtain an uplink signal in a fifth frequency band through separation from the uplink signals that are sent by the antenna and received by the first port 201. The fifth band-pass filter 403 may receive an amplified uplink signal that is in the fifth frequency band and that is output by the second amplifier 402. In other words, the fourth band-pass filter 401 and the fifth band-pass filter 403 may process a same frequency band. The fourth band-pass filter 401 may obtain an uplink signal in a frequency band through filtering, and the fifth band-pass filter 403 may receive an amplified uplink signal in the frequency band.

For example, the tower mounted amplifier processes signals of frequency bands such as the band 8, the band 20, and the band 28. When processing an uplink signal, the tower mounted amplifier shown in FIG. 2 may process the uplink frequency band of the band 20 and the uplink frequency band of the band 8, and temporarily does not process the uplink frequency band of the band 28. Therefore, the fourth band-pass filter 401 and the fifth band-pass filter 403 may be configured to process the uplink frequency band of the band 28. In this case, the fifth frequency band may range from 703 MHz to 748 MHz, or may be indicated as [703 MHz, 748 MHz].

After the fourth band-pass filter 401, the second amplifier 402, and the fifth band-pass filter 403 are added to the tower mounted amplifier, a procedure of amplifying an uplink signal is described as follows:

A coupled uplink signal from the antenna passes through the first port 201, the first band-pass filter 202 receives the uplink signal from the first port 201, and the fourth band-pass filter 401 also receives the uplink signal from the first port 201. For a processing process after the first band-pass filter 202 receives the uplink signal, refer to the foregoing description. The following focuses on a processing process after the fourth band-pass filter 401 receives the uplink signal. The fourth band-pass filter 401 separates, through filtering, the uplink signal to obtain an uplink signal in the band 28, the fourth band-pass filter 401 sends, to the second amplifier 402 for amplification, the uplink signal that is in the band 28 and that is obtained through separation, the fifth band-pass filter 403 receives the amplified uplink signal that is in the band 28 and that is output by the second amplifier 402, and the fifth band-pass filter 403 outputs the received amplified uplink signal in the band 28 to the base station by using the second port 205. In this case, a process of receiving and amplifying the uplink signal is completed. The second band-pass filter 204 may send the obtained amplified uplink signal in the band 20 and the obtained amplified uplink signal in the band 8 to the first combiner, the fifth band-pass filter 403 may also send the amplified uplink signal in the band 28 to the first combiner, and then the first combiner combines the signals, and outputs a signal obtained through combination to the base station by using the second port 205.

Figure 4B:
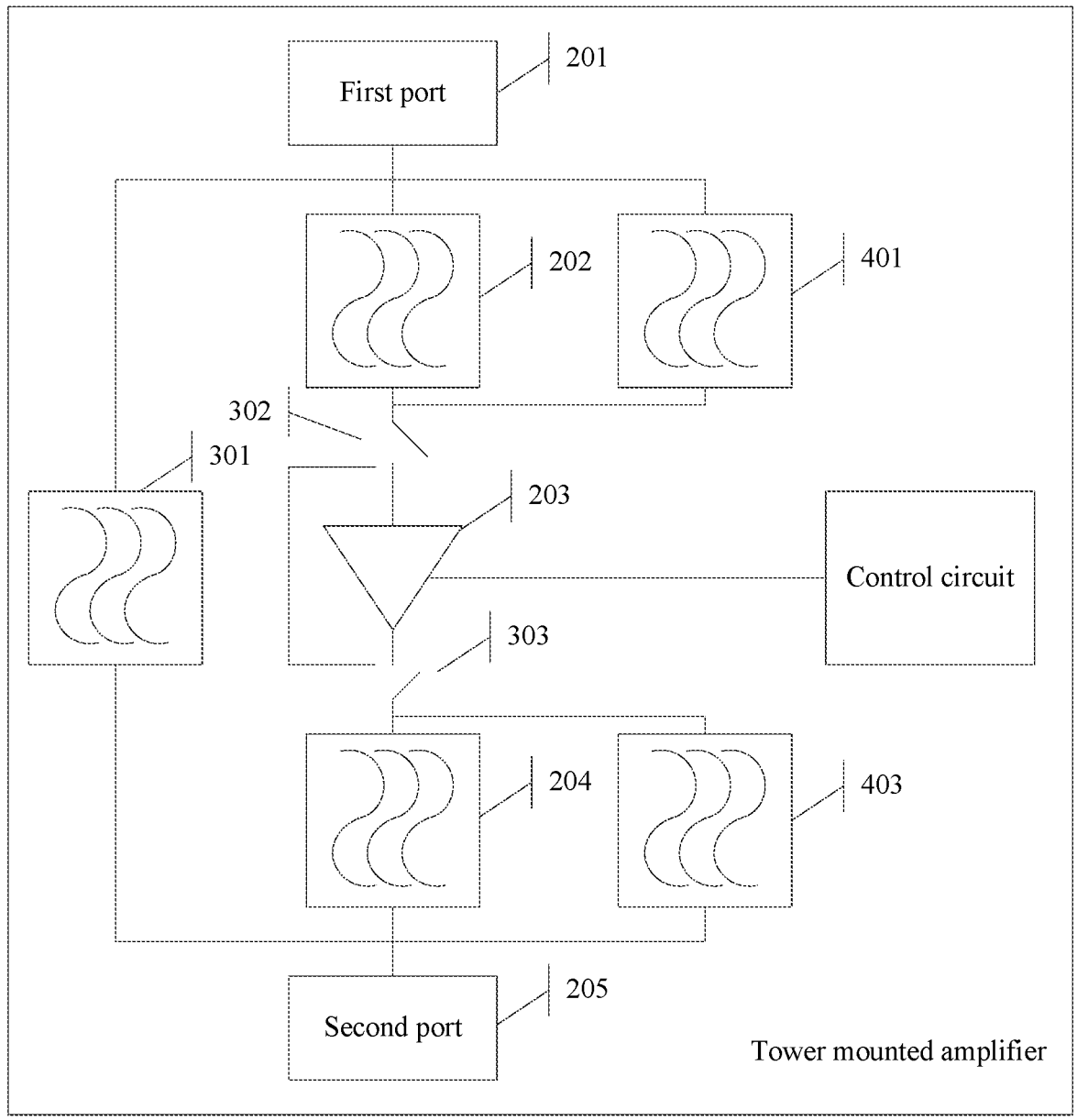

In FIG. 4A, the first amplifier 203 and the second amplifier 402 are two different amplifiers. In actual design, to reduce a quantity of components, the first amplifier 203 and the second amplifier 402 may also be a same amplifier, in other words, the first band-pass filter 202, the second band-pass filter 204, the fourth band-pass filter 401, and the fifth band-pass filter 403 may share one amplifier. In FIG. 4B, the first amplifier 203 and the second amplifier 402 are considered as a same amplifier, and the amplifier is marked as the first amplifier 203 in FIG. 4B.

A case in which the tower mounted amplifier includes a band-pass filter that can obtain an uplink signal in at least one frequency band through filtering is described above. In addition, in this embodiment of the present application, the tower mounted amplifier may further include a band-pass filter that can obtain a downlink signal in at least one frequency band through filtering, details are described below.

Figure 5:
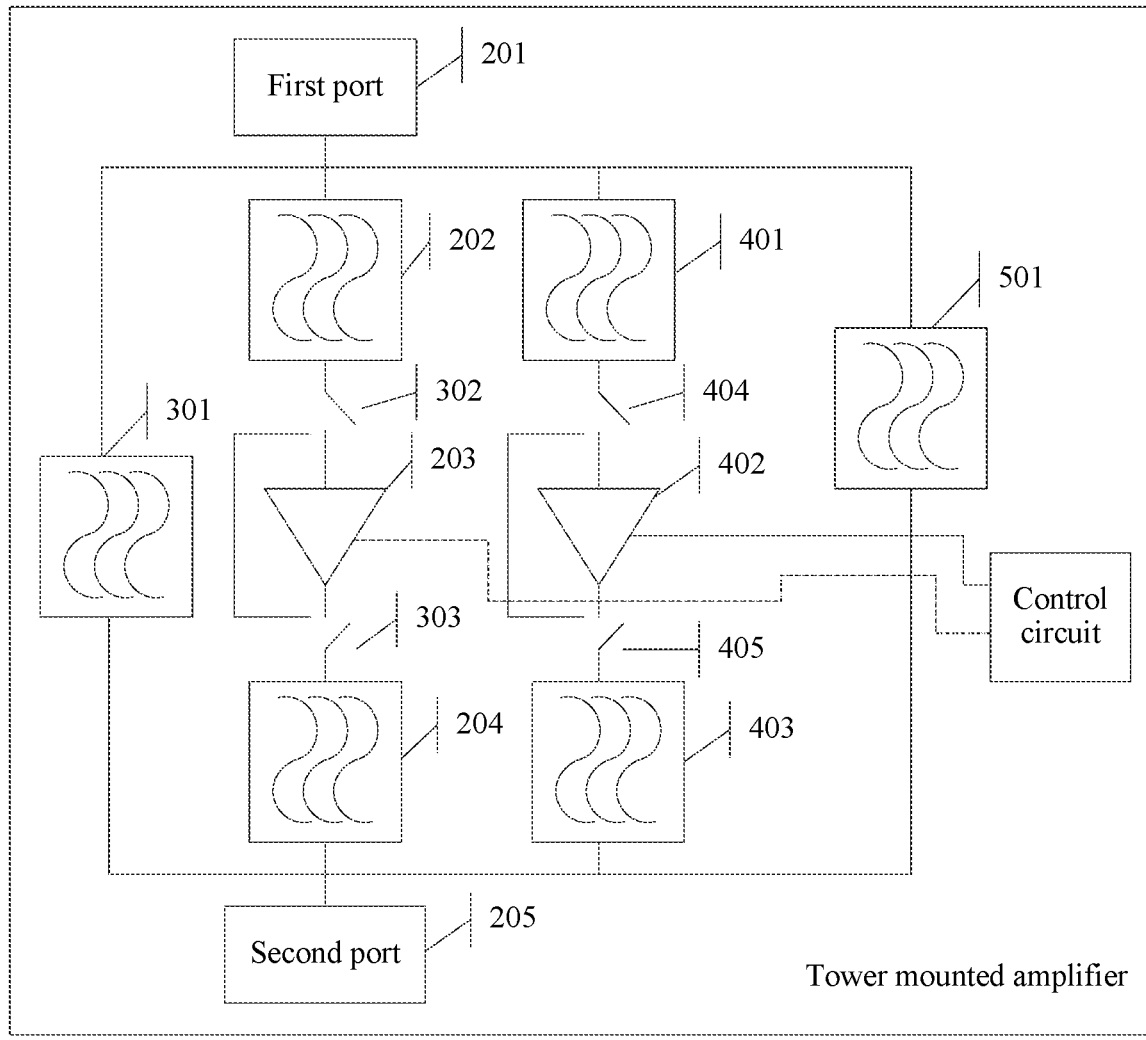
FIG. 5 is a schematic diagram of a tower mounted amplifier to which a sixth band-pass filter is added according to an embodiment of the present application.

Referring to FIG. 5, in an implementation, the tower mounted amplifier may further include a sixth band-pass filter 501, an input end of the sixth band-pass filter 501 is connected to the second port 205, and an output end of the sixth band-pass filter 501 is connected to the first port 201. The sixth band-pass filter 501 is configured to: obtain a downlink signal in at least one frequency band through separation from the downlink signals that are sent by the base station and received by the second port 205, and output the downlink signal in the at least one frequency band to the antenna by using the first port 201. The sixth band-pass filter 501 and the third band-pass filter 301 may coexist in the tower mounted amplifier, or only one of the sixth band-pass filter 501 and the third band-pass filter 301 may exist in the tower mounted amplifier In an implementation, the sixth band-pass filter 501 may obtain a downlink signal in a sixth frequency band through separation from the downlink signals that are sent by the base station and received by the second port 205, in other words, the sixth band-pass filter 501 may obtain a downlink signal in one frequency band through filtering.

That the tower mounted amplifier processes frequency bands such as the band 8, the band 20, and the band 28 is still used as an example. When processing a downlink signal, the tower mounted amplifier shown in FIG. 3 may process the downlink frequency band of the band 20 and the downlink frequency band of the band 28, and temporarily does not process the downlink frequency band of the band 8.

Therefore, the sixth band-pass filter 501 may be configured to process the downlink frequency band of the band 8. In this case, the sixth frequency band may range from 925 MHz to 960 MHz, or may be indicated as [925 MHz, 960 MHz].

After the sixth band-pass filter 501 is added, the tower mounted amplifier can amplify a downlink signal. A procedure of amplifying a downlink signal by the tower mounted amplifier is described as follows:

A downlink signal from the base station passes through the second port 205, the third band-pass filter 301 receives the downlink signal from the second port 205, and the sixth band-pass filter 501 also receives the downlink signal from the second port 205. For a processing process after the third band-pass filter 301 receives the downlink signal, refer to the foregoing descriptions. The following focuses on a processing process after the sixth band-pass filter 501 receives the downlink signal. The sixth band-pass filter 501 separates, through filtering, the downlink signal to obtain a downlink signal in the band 8. The sixth band-pass filter 501 outputs the obtained downlink signal in the band 8 to the antenna by using the first port 201. In this case, the process of amplifying a downlink signal is completed. The third band-pass filter 301 may send the obtained downlink signal in the band 20 and the obtained downlink signal in the band 28 to the second combiner, the sixth band-pass filter 501 may also send the obtained downlink signal in the band 8 to the second combiner, and the second combiner combines the signals, and outputs a signal obtained through combination to the antenna by using the first port 201.

Figure 6:
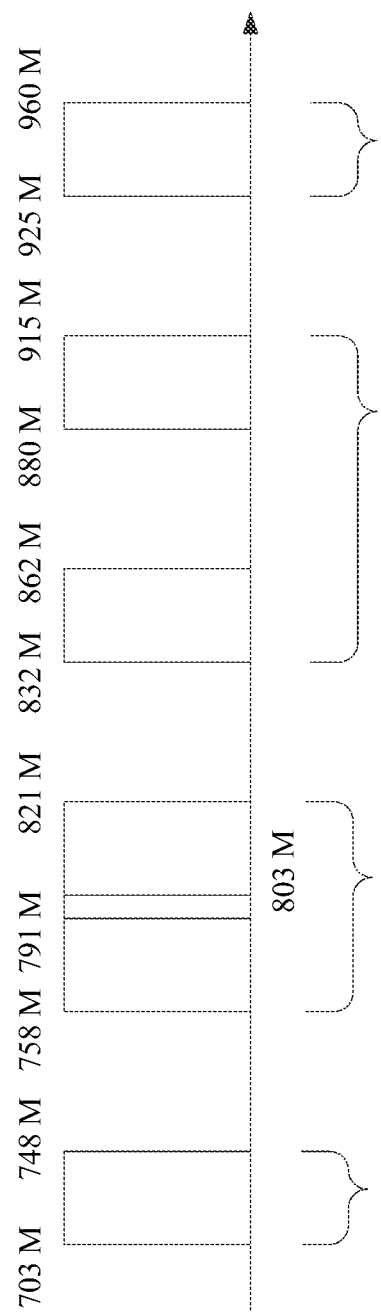
FIG. 6 is a schematic diagram of a band-pass filter disposing manner according to an embodiment of the present application.

In conclusion, FIG. 6 is a schematic diagram of a manner of disposing a band-pass filter in a tower mounted amplifier when frequency bands such as a band 8, a band 20, and a band 28 need to be processed according to an embodiment of the present application. There are a downlink frequency band of the band 20 and a downlink frequency band of the band 28 between the uplink frequency band [703 MHz, 748 MHz] belonging to the band 28 and the uplink frequency band of the band 20, and therefore the uplink frequency band [703 MHz, 748 MHz] belonging to the band 28 may be processed by using a band-pass pre-filter and a band-pass post-filter. The band-pass pre-filter configured to process the uplink frequency band may be the fourth band-pass filter 401, and the band-pass post-filter configured to process the uplink frequency band may be the fifth band-pass filter 403. The downlink frequency band [758 MHz, 803 MHz] belonging to the band 28 and the downlink frequency band [791 MHz, 821 MHz] belonging to the band 20 may be processed by using one band-pass filter because the two downlink frequency bands are intersected, and the band-pass filter configured to process the two downlink frequency bands may be the third band-pass filter 301. Because there is no downlink frequency band of the band 8, band 20, and the band 28 between the uplink frequency band [832 MHz, 862 MHz] belonging to the band 20 and the uplink frequency band [880 MHz, 915 MHz] belonging to the band 8, the two uplink frequency bands may be processed by using a band-pass pre-filter and a band-pass post-filter. The band-pass pre-filter configured to process the two uplink frequency bands may be the first band-pass filter 202, and the band-pass post-filter configured to process the two uplink frequency bands may be the second band-pass filter 204. The downlink frequency band [925 MHz, 960 MHz] belonging to the band 8 may be processed by using one band-pass filter because there are the uplink frequency band of the band 8 and the uplink frequency band of the band 20 between the downlink frequency band belonging to the band 8 and both the downlink frequency band of the band 20 and the downlink frequency band of the band 28. The band-pass filter configured to process the downlink frequency band may be the sixth band-pass filter 501.

In addition, in addition to the components such as the filters described above, the tower mounted amplifier may include some other possible components or functional modules such as a lightning protection module. For this part of content, refer to the prior art.

In this embodiment of the present application, the band 8, the band 20, and the band 28 are used as an example. In actual application, a frequency band that needs to be processed by the tower mounted amplifier is not limited thereto. Therefore, a quantity of band-pass filters in the tower mounted amplifier, signals of specific frequency bands that are obtained by each band-pass filter through filtering, and the like may also be set based on the frequency band that needs to be processed by the tower mounted amplifier.

Figure 7:
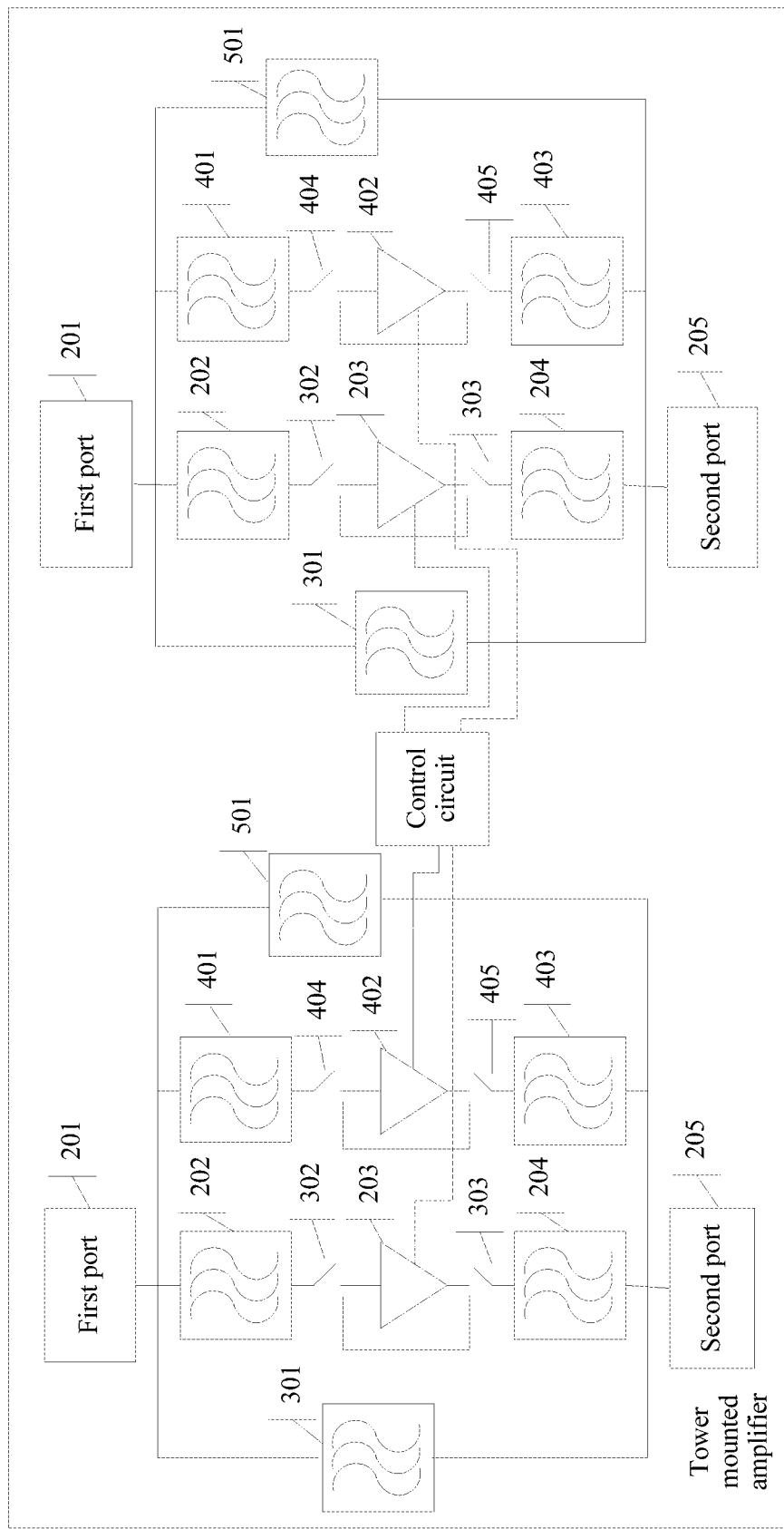
FIG. 7 is a schematic diagram of a tower mounted amplifier suitable to a 2T2R base station according to an embodiment of the present application.

Any tower mounted amplifier shown in FIG. 2 to FIG. 5 in this embodiment of the present application has a port connected to the antenna and a port connected to the base station. Therefore, such amplifiers may be used for a 1T1R base station. 1T1R indicates that one transmit antenna and one receive antenna are disposed on the base station. To use any tower mounted amplifier shown in FIG. 2 to FIG. 5 to a 2T2R base station, that is, a base station on which two transmit antennas and two receive antennas are disposed, for example, the tower mounted amplifier shown in FIG. 5 is used for the 2T2R base station, it can be learned from FIG. 7 that only a quantity of corresponding components disposed on the tower mounted amplifier needs to be doubled. Likewise, if a quantity of corresponding components disposed on the tower mounted amplifier is quadrupled, the tower mounted amplifier may be used for a 4T4R base station, and so on.

Certainly, if more components are included in the tower mounted amplifier, the volume of the tower mounted amplifier is larger, and costs also increase. Therefore, if the tower mounted amplifier is applied to a base station with a relatively large quantity of antennas, a band-pass filter in the tower mounted amplifier needs to be able to process signals of as more frequency bands as possible. In this way, a quantity of filters in the tower mounted amplifier can be reduced as much as possible, thereby reducing costs while reducing the volume of the tower mounted amplifier, and this is favorable to actual application.

In the embodiments of the present application, the band-pass filter is disposed, so that signals of relatively more frequency bands can be processed by using a relatively small quantity of filters, thereby reducing a quantity of hardware in the tower mounted amplifier, and reducing the volume of the tower mounted amplifier. In this way, the tower mounted amplifier is lighter and more convenient to use, and costs of the tower mounted amplifier can also be reduced because the quantity of required hardware is reduced.

The foregoing embodiments are merely used to describe the technical solutions of the present application. The foregoing embodiments are merely intended to help understand the method of the embodiments of the present application, and shall not be construed as a limitation on the embodiments of the present application. Any variation or replacement readily figured out by a person skilled in the art shall fall within the protection scope of the embodiments of the present application.

What is claimed is:
1. A tower mounted amplifier, comprising:
    a first port, wherein the first port is connected to an antenna, and wherein the first port is configured to perform signal interaction with the antenna;
    a first band-pass filter, wherein an input end of the first band-pass filter is connected to the first port, and wherein the first band-pass filter is configured to obtain signals in at least two frequency bands through separation from uplink signals that are sent by the antenna and received by the first port, wherein the uplink signals include coupled uplink signals sent by the antenna and received by the first port, and wherein the first band-pass filter separates, through filtering, the coupled uplink signals to obtain at least an uplink signal in a first frequency band and an uplink signal in a second frequency band;
    a first amplifier, wherein an input end of the first amplifier is connected to an output end of the first band-pass filter, and wherein the first amplifier is configured to amplify the uplink signals that are in the at least two frequency bands and that are output by the first band-pass filter;
a second band-pass filter, wherein an input end of the second band-pass filter is connected to an output end of the first amplifier, and wherein the second band-pass filter is configured to receive the amplified uplink signals that are in the at least two frequency bands and that are output by the first amplifier; and
a second port, wherein the second port is connected to an output end of the second band-pass filter and a base station, and wherein the second port is configured to output, to the base station, the amplified uplink signals that are in the at least two frequency bands and that are output by the second band-pass filter.

2. The tower mounted amplifier according to claim 1, wherein the first frequency band ranges from 832 MHz to 862 MHz, and wherein the second frequency band ranges from 880 MHz to 915 MHz.

3. The tower mounted amplifier according to claim 1, wherein the tower mounted amplifier further comprises a third band-pass filter, wherein an output end of the third band-pass filter is connected to the first port, wherein an input end of the third band-pass filter is connected to the second port, and wherein the third band-pass filter is configured to:
obtain downlink signals in at least two frequency bands through separation from downlink signals that are sent by the base station and received by the second port; and
output the downlink signals of the at least two frequency bands to the antenna by using the first port.

4. The tower mounted amplifier according to claim 3, wherein that the third band-pass filter is configured to obtain downlink signals in at least two frequency bands through separation from downlink signals that are sent by the base station and received by the second port comprises:
the third band-pass filter is configured to obtain a downlink signal in a third frequency band and a downlink signal in a fourth frequency band through separation from the downlink signals that are sent by the base station and received by the second port.

5. The tower mounted amplifier according to claim 4, wherein the third frequency band ranges from 791 MHz to 821 MHz, and wherein the fourth frequency band ranges from 758 MHz to 803 MHz.

6. The tower mounted amplifier according to claim 1, wherein the first amplifier is a low noise amplifier.

7. The tower mounted amplifier according to claim 1, wherein a control end of the first amplifier is connected to a control circuit in the tower mounted amplifier, and wherein the second port is also connected to the control circuit.

8. The tower mounted amplifier according to claim 1, wherein the tower mounted amplifier further comprises:
a fourth band-pass filter, wherein an input end of the fourth band-pass filter is connected to the first port, and wherein the fourth band-pass filter is configured to obtain an uplink signal in at least one frequency band through separation from the uplink signals that are sent by the antenna and received by the first port;
a second amplifier, wherein an input end of the second amplifier is connected to an output end of the fourth band-pass filter, and wherein the second amplifier is configured to amplify the uplink signal that is in the at least one frequency band and that is output by the fourth band-pass filter; and
a fifth band-pass filter, wherein an input end of the fifth band-pass filter is connected to an output end of the second amplifier, and wherein the fifth band-pass filter is configured to:
receive the amplified uplink signal that is in the at least one frequency band and that is output by the second amplifier; and
output the amplified uplink signal in the at least one frequency band to the base station by using the second port.

9. The tower mounted amplifier according to claim 1, wherein the tower mounted amplifier further comprises a sixth band-pass filter, wherein an output end of the sixth band-pass filter is connected to the first port, wherein an input end of the sixth band-pass filter is connected to the second port, and wherein the sixth band-pass filter is configured to:
obtain a downlink signal in at least one frequency band through separation from the downlink signals that are sent by the base station and received by the second port; and
output the downlink signal in the at least one frequency band to the antenna by using the first port.

* * * * *